United States Patent
Baumgartner et al.

(10) Patent No.: US 11,099,222 B2
(45) Date of Patent: Aug. 24, 2021

(54) NEAR-FIELD ELECTROSTATIC COMMUNICATIONS SYSTEM

(71) Applicants: Christopher T. Baumgartner, Downers Grove, IL (US); Ro Annis, Park Ridge, IL (US)

(72) Inventors: Christopher T. Baumgartner, Downers Grove, IL (US); Ro Annis, Park Ridge, IL (US)

(*) Notice: Subject to any disclaimer, the term of this patent is extended or adjusted under 35 U.S.C. 154(b) by 210 days.

(21) Appl. No.: 16/252,669

(22) Filed: Jan. 20, 2019

(65) Prior Publication Data

US 2020/0233023 A1 Jul. 23, 2020

(51) Int. Cl.
| | |
|---|---|
| *G01R 27/26* | (2006.01) |
| *G01D 5/24* | (2006.01) |
| *H04W 4/80* | (2018.01) |
| *H04L 27/20* | (2006.01) |
| *H04W 4/021* | (2018.01) |
| *H04L 27/10* | (2006.01) |

(52) U.S. Cl.
CPC .......... *G01R 27/2605* (2013.01); *G01D 5/24* (2013.01); *G01R 27/2641* (2013.01); *H04L 27/106* (2013.01); *H04L 27/2014* (2013.01); *H04W 4/022* (2013.01); *H04W 4/80* (2018.02)

(58) Field of Classification Search
CPC . G01R 27/2605; G01R 27/2641; H04W 4/80; H04W 4/022; H04L 27/106; H04L 27/2014; G01D 5/24
USPC .................................. 324/658–661, 754.28
See application file for complete search history.

(56) References Cited

U.S. PATENT DOCUMENTS

| | | | | |
|---|---|---|---|---|
| 4,763,340 A | * | 8/1988 | Yoneda | G06K 7/10326 375/377 |
| 5,063,348 A | * | 11/1991 | Kuhara | G01R 33/3607 324/307 |
| 5,437,057 A | * | 7/1995 | Richley | H04B 5/0012 343/867 |
| 5,625,883 A | * | 4/1997 | Leyten | H04B 1/20 336/232 |

(Continued)

OTHER PUBLICATIONS

See PCT/US20/14294 ISA written opinion. (Year: 2020).*
PCT/US/14294 Written opinion of ISA, dated May 21, 2020.
PCT/US/14294 International Search Report, dated May 21, 2020.

*Primary Examiner* — Patrick Assouad
*Assistant Examiner* — Sean Curtis
(74) *Attorney, Agent, or Firm* — Clifford H. Kraft (57) ABSTRACT

A near-field capacitive data communication system that uses a variable capacitive device such as a PIN diode to change the capacitance of a conductive plate in response to either a high or low data signal. A detector attached to a second conductive plate that is in proximity to the first conductive plate measures the capacitance of the first conductive plate and outputs a corresponding data signal. The technique is wireless, since the two conductive plates are not in electrical contact with one-another, but rather share their static electric fields. A microcontroller can act as a detector by baselining the capacitance of the first conductive plate when its capacitance is in the low capacitance state. The technique is ideal for communication between a pair of toys that can be brought in close proximity to one-another. Since no radio frequencies are used, no special testing or governmental electromagnetic compatibility rules apply.

19 Claims, 7 Drawing Sheets

(56) References Cited

U.S. PATENT DOCUMENTS

| | | | | |
|---|---|---|---|---|
| 5,847,447 A * | 12/1998 | Rozin | ............... | G06K 7/087 |
| | | | | 257/678 |
| 6,336,031 B1 * | 1/2002 | Schyndel | ............... | H04B 13/00 |
| | | | | 340/870.37 |
| 6,424,232 B1 * | 7/2002 | Mavretic | ............... | H01J 37/32082 |
| | | | | 333/17.3 |
| 6,439,956 B1 * | 8/2002 | Ho | ............... | A63F 13/02 |
| | | | | 446/454 |
| 6,614,399 B2 * | 9/2003 | Trumbull | ............... | H01Q 1/243 |
| | | | | 343/700 MS |
| 7,979,754 B2 * | 7/2011 | Drost | ............... | H01L 25/0657 |
| | | | | 714/704 |
| 8,041,227 B2 * | 10/2011 | Holcombe | ............... | H04B 10/1143 |
| | | | | 398/138 |
| 8,150,315 B2 * | 4/2012 | Canegallo | ............... | H04B 5/0012 |
| | | | | 455/41.1 |
| 8,247,946 B2 * | 8/2012 | Chiang | ............... | F03G 7/005 |
| | | | | 310/311 |
| 8,396,136 B1 * | 3/2013 | Pezeshkian | ............... | H04B 5/0012 |
| | | | | 375/257 |
| 8,604,664 B2 * | 12/2013 | Chiang | ............... | F03G 7/005 |
| | | | | 310/311 |
| 8,886,137 B2 * | 11/2014 | Mahmood | ............... | H01P 1/15 |
| | | | | 455/83 |
| 9,130,606 B2 * | 9/2015 | Bosenko | ............... | H04L 25/20 |
| 9,147,636 B2 * | 9/2015 | Canegallo | ............... | H01L 22/34 |
| 9,344,184 B2 * | 5/2016 | Schrader | ............... | H04B 7/24 |
| 9,692,526 B2 * | 6/2017 | Linnartz | ............... | H04B 13/005 |
| 9,923,645 B2 * | 3/2018 | Linnartz | ............... | H04B 1/385 |
| 10,677,904 B2 * | 6/2020 | Saitou | ............... | G08B 21/22 |
| 10,714,314 B1 * | 7/2020 | Bhutta | ............... | H01L 21/67069 |
| 10,720,309 B1 * | 7/2020 | Lozic | ............... | H03H 7/38 |
| 10,741,364 B1 * | 8/2020 | Lozic | ............... | H03H 7/38 |
| 2003/0032396 A1 * | 2/2003 | Tsuchiya | ............... | H03F 3/24 |
| | | | | 455/127.1 |
| 2004/0008124 A1 * | 1/2004 | Schaefer | ............... | H04B 13/02 |
| | | | | 340/850 |
| 2007/0089513 A1 * | 4/2007 | Rosenau | ............... | G01D 5/24 |
| | | | | 73/514.32 |
| 2009/0251382 A1 * | 10/2009 | Umehara | ............... | H01Q 1/38 |
| | | | | 343/850 |
| 2014/0120968 A1 * | 5/2014 | Mahmood | ............... | H01P 1/15 |
| | | | | 455/501 |
| 2014/0226700 A1 * | 8/2014 | Bosenko | ............... | H04B 5/0012 |
| | | | | 375/214 |
| 2014/0335788 A1 * | 11/2014 | Schrader | ............... | A22C 18/00 |
| | | | | 455/41.2 |
| 2018/0081048 A1 * | 3/2018 | Saitou | ............... | G01V 3/12 |
| 2018/0089583 A1 * | 3/2018 | Iyer | ............... | G06F 3/147 |
| 2019/0212843 A1 * | 7/2019 | Reese | ............... | A63H 5/00 |
| 2020/0203130 A1 * | 6/2020 | Bhutta | ............... | H01L 21/31138 |
| 2020/0233023 A1 * | 7/2020 | Baumgartner | ...... | G01R 27/2605 |
| 2020/0234926 A1 * | 7/2020 | Lozic | ............... | H01L 21/31116 |
| 2020/0234927 A1 * | 7/2020 | Lozic | ............... | H01L 21/28556 |
| 2020/0316483 A1 * | 10/2020 | Reese | ............... | G06F 3/165 |

* cited by examiner

NEAR-FIELD ELECTROSTATIC COMMUNICATIONS SYSTEM

BACKGROUND

Field of the Invention

The present invention relates generally to near-field communications and more particularly to a near-field electrostatic communications system that can exchange data between devices in close proximity to one-another such as two toys.

Description of the Prior Art and the Problem Solved

Near-field communication using a radio frequency magnetic field (or a static magnetic field) is well-known in the art being available on most handheld telephones and other electronic devices today. Also, electrostatic, or capacitance, sensing electrodes are in common use typically to detect a human touch such as with touch screens or touch-activated buttons. These devices work over an adjustable range of distances. Typically, software performs a baseline calibration of the capacitance and performs signal averaging allowing the device to detect even very weak capacitive loading of the electrode. Due to drift caused by temperature variations and other changes in ambient conditions, software typically performs continuous baseline calibration.

Such prior art capacitive detectors are not typically used to transfer data. There are data transfer systems known in the art that transfer data using a near-field radio frequency (RF) electric field. These systems operate using small antennas that exhibit high radiation impedances in the near-field. These systems run very low power and can communicate over distances of a few feet. However, they do radiate electromagnetic energy which is undesirable, even at low power.

What is needed is a very close proximity (touching or almost touching) system that uses the static electric field of a capacitor to communicate data. Since the field is DC, there is no radiated RF. This type of system would be particularly attractive for communication between two toys activated by bringing the toys very close together.

SUMMARY OF THE INVENTION

The present invention relates to a low-power, low-cost system that facilitates wireless communication between two small objects such as between two toys. A capacitance sensing technology is used to establish a communication link by communicating the capacitance between the objects using solid state electronic circuits. In this manner, the same capacitance transducer of either object can act as a transmitter as well as a receiver. Signals sent from the transmitter to the receiver, similar to actual touches, can trigger the start of a communication sequence between the two objects.

The two objects are placed in close proximity to one-another with their sensing electrodes approximately parallel. The first object, which can be called the transmitter, with its circuit off, appears as a low capacitance to the second object, which can be called the receiver. The receiver uses the low capacitance state as a baseline for calibration. When the transmitter turns on, it raises its capacitance electronically, and the receiver detects the delta capacitance above the baseline. A forward link is thus established. Communication can then take place by switching the transmitter's capacitance between the high and low states. OOK (On-Off-Keying), or other signaling techniques, can be used to transmit a stream of binary data at low speed using any desired higher level communication protocol or system of handshakes. The link can be reversed upon a signal from the original transmitter, or upon an internal timeout. Here, the process is reversed—the original receiver goes to the low capacitance state, and the original transmitter calibrates a baseline and becomes the new receiver. This process can go on as long as desired with any number of link reversals.

DESCRIPTION OF THE FIGURES

Attention is now directed to several figures that illustrate features of the present invention.

Several illustrations have been presented to aid in understanding the present invention. The scope of the present invention is not limited to what is shown in the figures.

DESCRIPTION OF THE PREFERRED EMBODIMENTS

The present invention relates to a low-power, electrostatic data communications system that uses the capacitance between a sensor plate and ground of a first object that is measured by a similar sensor plate on a second object. The system is ideal for communication between two toys. Data is transmitted by changing the capacitance electronically.

The communication at any particular time is unidirectional; however, the two devices can switch roles, and hence carry on a data conversation. The result is a bidirectional communication system between the two objects.

To start the process, one of the objects (the first transmitter) simply raises its capacitance, causing the second object (the first receiver) to detect a delta from an established low capacitance baseline. Data communication can then take place by the present transmitter raising and lowering its capacitance using OOK (Off-On-Keying) or any other form of modulation. In the case of OOK, the high capacitance state can be considered ON or binary one, while the low capacitance state can be considered OFF or binary zero. Any higher level communications protocol may be used on top of the OOK signaling. This can include coded commands or requests, handshakes and the like known in the art. The link can be reversed at any time by a "reverse" command from the present transmitter to the present receiver or simply by a timeout, or by other means.

Figure 1A:
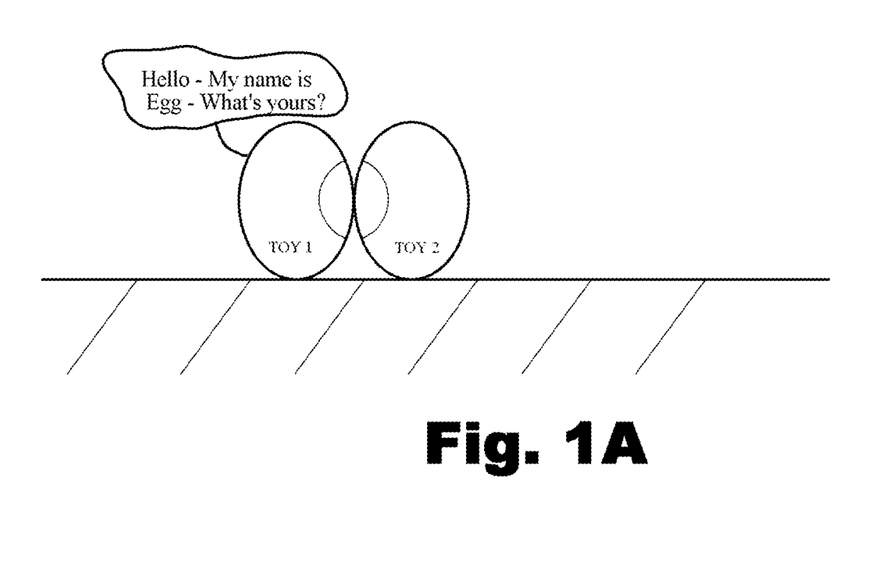
FIGS. 1A and 1B show two toys communicating.
Figure 1B:
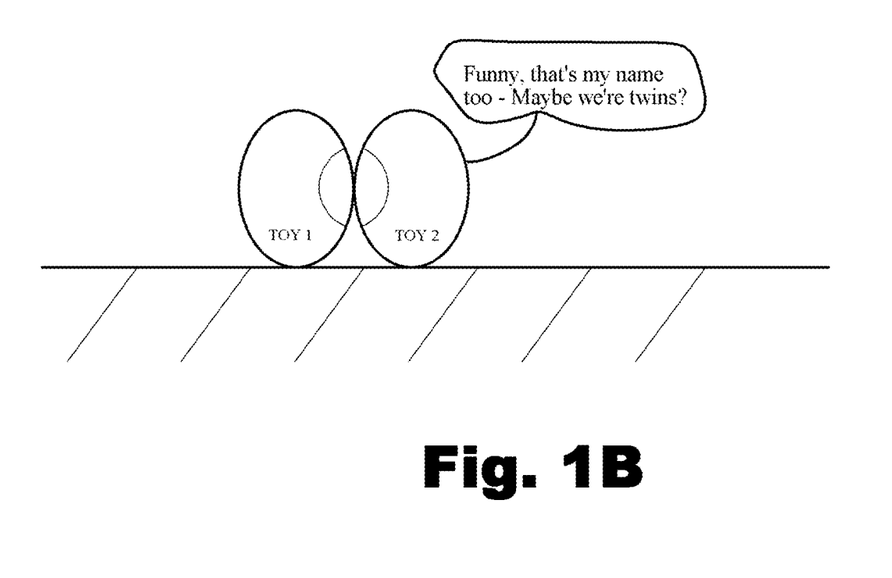

FIGS. 1A-1B show an example application of the communication system of the present invention. Turning to FIG. 1A, a first toy egg is brought into contact, or near contact, with a second similar toy egg. Each egg has a recorded series of voice exchange segments along with a small speaker to play the recordings. One of the toys is designated the first transmitter, while the other is designated as the first receiver. When the two toys are brought into contact, the sequence begins. The first transmitter goes to the low capacitance state for a short period while the first receiver calibrates and develops a baseline capacitance. The first transmitter then transmits a short data sequence indicating that it is going to play its first audio segment. It then plays the audio through the speaker (in this example playing the sequence: "Hello my name is egg—what is your name?"). It then sends a data signal to the first receiver indicating that it has finished speaking. It can optionally reverse the link at this point by sending a "link reverse command". The second toy begins playing its first recorded sequence at this point (in this example: "Funny, that's my name too—maybe we're twins."). As stated, the link can either reverse upon each exchange, or alternatively stay fixed with timed sequences. Any desired high-level data exchange is within the scope of the present invention. The example of FIGS. 1A-1B is for illustration only. Any type of interaction or exchange between the two objects can take place, and any type of actions in response to the data exchange can take place.

As previously stated, when the transmitter is ON, the capacitance between the electrodes is high. This is typically controlled by a voltage-controlled capacitance device such as a PIN diode. The receiver detects the presence of the ON condition because of the delta capacitance between its calibrated OFF state low capacitance baseline. Once the forward link is established, the OOK sequence can begin with any number of data bytes transmitted. Since ambient drift is a slow process, the stored capacitance baseline at the receiver is reliable for the duration of the data exchanges.

Figure 2A:
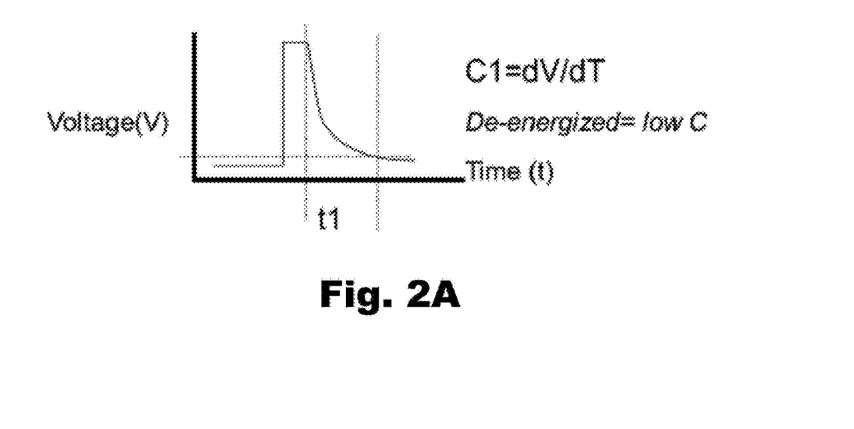
FIGS. 2A and 2B show the low and high capacitance states respectively.
Figure 2B:
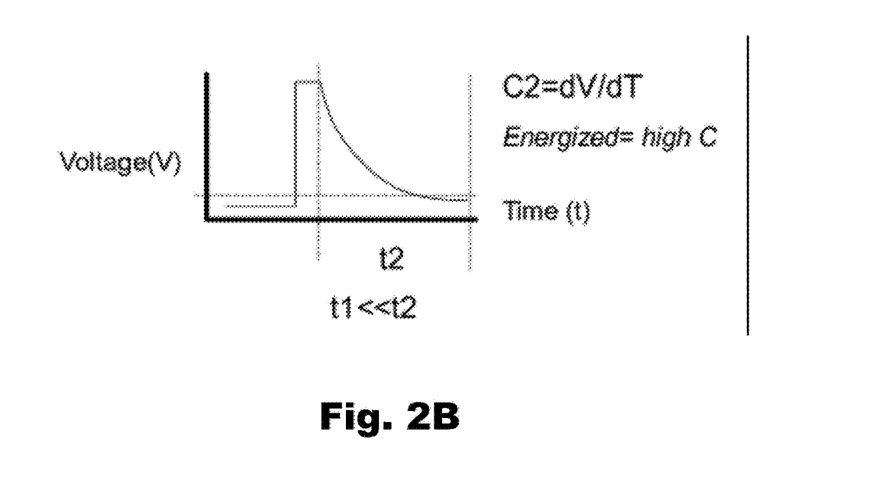

FIG. 2A shows a discharge timing diagram of a low capacitance (OFF) state, while FIG. 2B shows a discharge timing diagram of a high capacitance (ON) state. A pulse is applied to the target capacitance. The discharge time through a known resistance determines which state the capacitance is in. The actual detection problem thus becomes one of simply measuring the discharge time. The signal to noise ratio is high because of the close proximity of the two devices, even at very low power levels.

Figure 3:
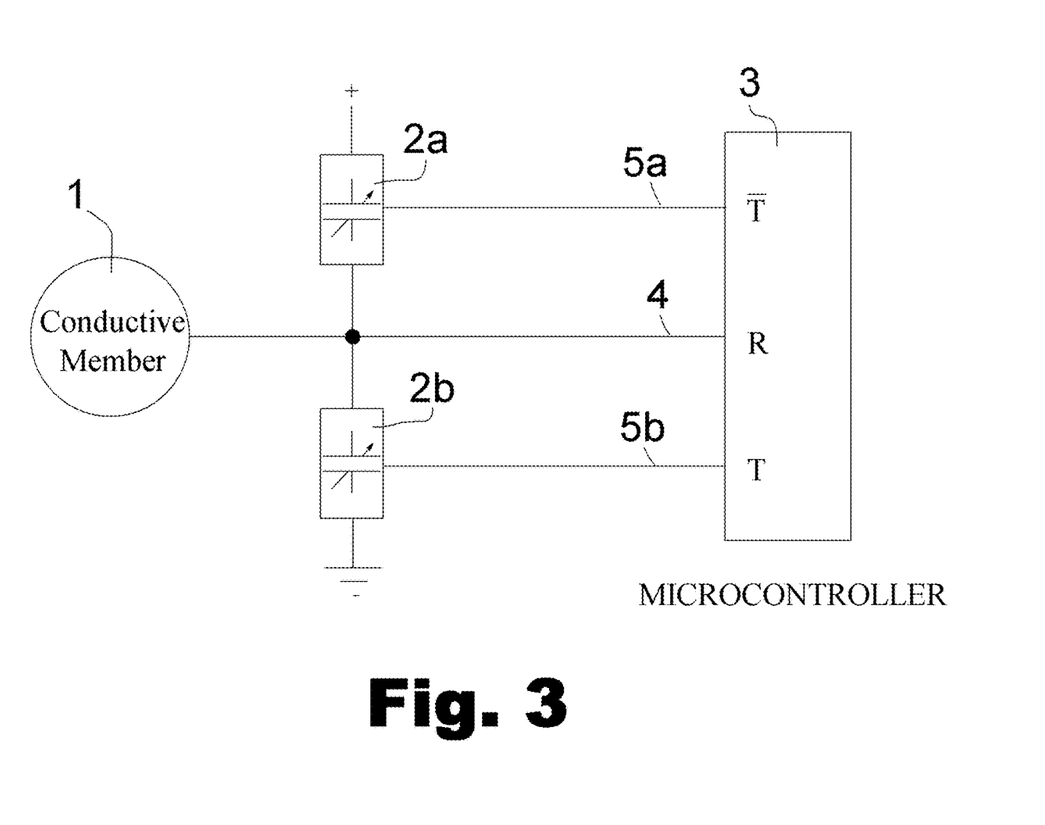
FIG. 3 shows a block diagram of an embodiment of the present invention.

FIG. 3 shows a block diagram of an embodiment of the present invention. A conductive plate or other member 1 is connected between two voltage-controlled capacitance devices 2a and 2b. These can be PIN diodes (P material, Insulator material, N material) or any other type of voltage controlled capacitors. A microcontroller 3 has a transmit 5a and complementary transmit 5b line. During transmit, signals on these lines are data pulses that are 180 degrees out of phase to drive the two voltage controlled capacitors 2a, 2b. The microcontroller also has a receive line 4 which is kept in a high impedance state (Hi-Z) during transmit so as to not upset the capacitance. During receive, the voltage controlled capacitors 2a and 2b are locked to their minimum capacitance state, while the receive line 4 on the microcontroller is used to measure the capacitance on the similar plate on the transmitter device (by for example reading the voltage on the receive plate, converting it to digital with an internal analog to digital converter (A to D), and measuring the discharge time on each data pulse supplied by the transmitter. Alternatively, some microcontrollers can measure capacitance directly. Any method of measuring capacitance is within the scope of the present invention.

Figure 4:
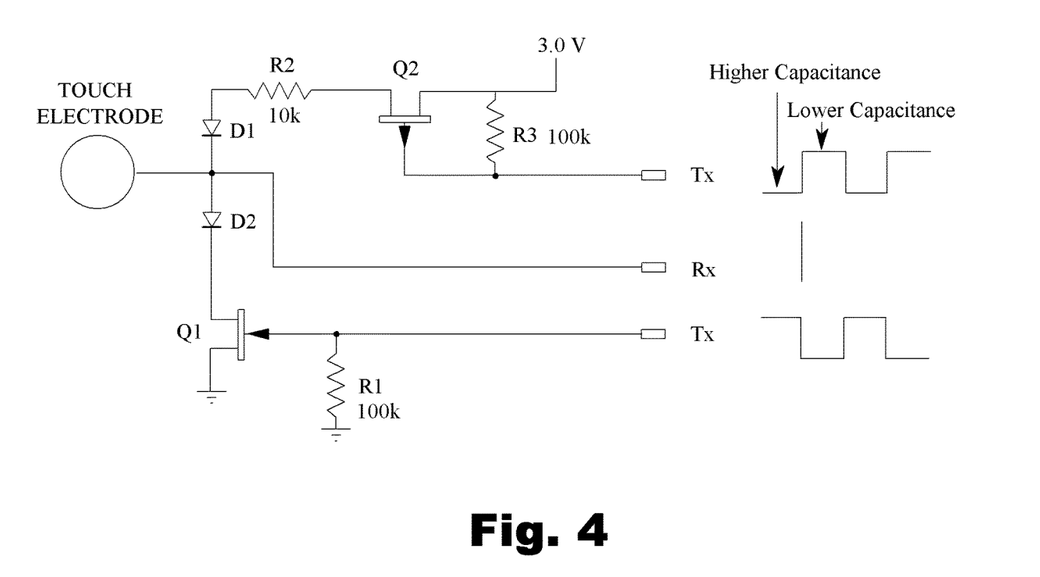
FIG. 4 shows a circuit embodiment that realizes the present invention in hardware

FIG. 4 shows an embodiment circuit of a device that realizes the present invention. Two PIN diodes D1 and D2 are wired in series between two FET transistors. The coupling electrode is attached to the point between the two diodes. The PIN diodes perform a capacitive connection or isolation function. When the diodes are unbiased, they present a very low capacitance to the electrode. When they are biased, their rated capacitance appears between the electrode and ground. In the transmit mode, the first transistor Q2 provides forward bias to both diodes. This can be turned on and off by switching Q2. In the receive mode, the diodes are unbiased. However, incoming pulses on the Rx lead would tend to forward bias D2. Since this is undesirable, transistor Q1 is needed to prevent this. The gates of the two transistors are thus run 180 degrees out of phase during transmit, while the two transistors are both off during receive. Additionally, the Rx lead (that is typically wired to a microcontroller) is set to the high impedance (high-Z) state during transmit so as to not affect the bias circuit.

A method of producing digital communications with the system described includes changing the capacitance of a conductive member according to a data signal in a transmitter, and measuring that capacitance with a detector in a receiver to reproduce the data signal. However, the modulation of the present invention is not limited to On-Off keying. Similar inter-device capacitance circuits can be used to produce higher level modulation schemes, and thus pass more data per electrode/channel.

Figure 5:
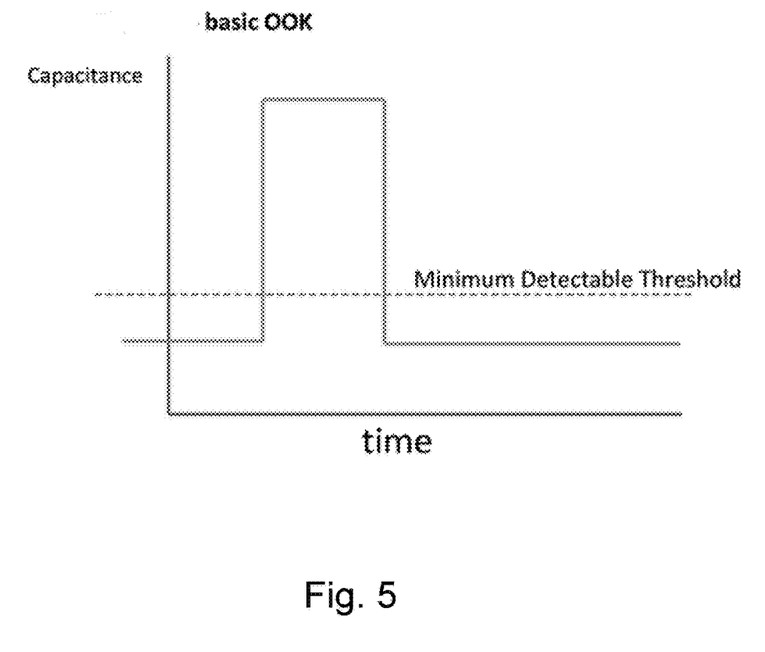
FIG. 5 shows a level diagram of off-on keying OOK.
Figure 6:
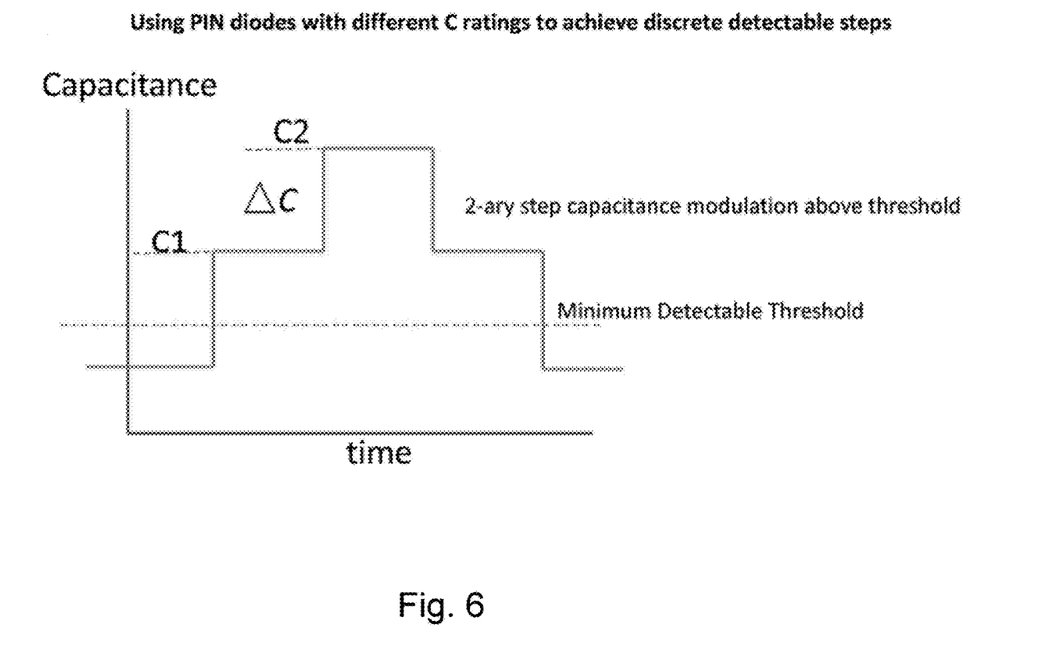
FIG. 6 shows a level diagram of m-ary ASK modulation with m=2.
Figure 7:
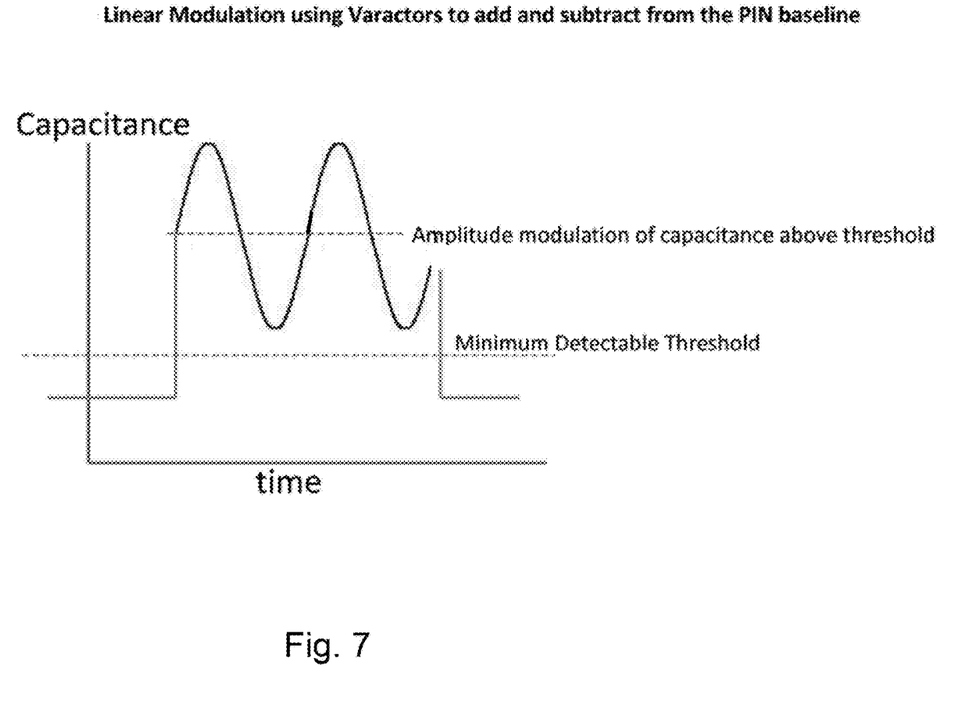
FIG. 7 shows a level diagram of continuous amplitude modulation.

The circuit of FIG. 4 uses pin diodes to produce a detectable change in capacitance above a minimum detectable threshold, OOK; however, the use of a variable capacitance circuit as a load can create either a step or linear modulation of the capacitance field above the detectable threshold. FIG. 5 shows a level diagram of simple OOK, while FIG. 6 shows a level diagram of 2-ary amplitude shift keying (ASK). The circuit of the present invention circuit can include either multiple PIN diodes of different capacitance values to achieve discrete capacitive steps such as shown in FIG. 6, or can include series varactor diodes to produce linear modulation of the capacitance above the threshold as shown in FIG. 7. Here, the capacitance is varied linearly to produce amplitude modulation.

The advantages of the embodiments of FIGS. 6-7 is the ability to send more data than a simple binary on or off, and achieve the coding gain associated with the higher forms during the detection process. The present invention provides similar functionality to the near field NFC standard, but without using radio frequencies (RF).

Experiments have shown good readability with electrodes that are round metal plates of approximately one inch in diameter, and at separations up to ⅓ inch. Air gap, as well as transmission through plastic and faux fur have been tested. Keeping the electrodes parallel, centered and in as close proximity as possible aids in sensitivity. As stated, the electrodes can be small metal plates or can be metal-coated plastic, conductive paint spots or any other type of conductive member.

The present invention has an advantage in that it leverages the existing capacitance sensing capability of common toy microcontrollers in combination with relatively inexpensive and small PIN diodes to achieve wireless connectivity. The wireless connectivity is not subject to government regulatory rules such as FCC wireless standards and thus requires no special product testing. The communication is unaffected by ambient light, scratches or dirt on the object or toy, and can be hidden under a painted surface (it should be noted that the use of a microcontroller itself does invoke regulatory requirements as to radiated emissions from the processor and associated circuitry).

Several descriptions and illustrations have been presented to aid in understanding the present invention. One with skill in the art will realize that numerous changes and variations may be made without departing from the spirit of the invention. In particular, but not limited to, changes in protocol, signaling, keying, electrode size and the like. Each of these changes and variations is within the scope of the present invention.

We claim:

1. A capacitive communication system comprising: a transmitter and a receiver; wherein, the transmitter includes at least one adjustable capacitance semi-conductor device electrically connected to a first conductive plate; and wherein, the adjustable capacitance semi-conductor device changes its capacitance, and causes the capacitance of the first conductive plate to change when a bias voltage is applied to the semi-conductor device; a transmit signal lead and complementary transmit signal lead configured to apply the bias voltage to the semi-conductor device when a data high voltage is applied to the transmit signal lead and a data low voltage is applied to the complementary transmit signal lead, and to remove the bias voltage from the semi-conductor device when a data low voltage is applied to the transmit signal lead and a data high voltage is applied to the complementary transmit signal lead; the receiver having a second conductive plate electrically coupled to a detection unit, the detection unit constructed to measure the capacitance of the first conductive plate when the second conductive plate is in proximity to the first conductive plate; wherein the transmitter and receiver have identical circuits that can switch roles as to transmitter and receiver, the receiver having a receive signal lead constructed to be held in a low impedance state while receiving and a high impedance state during transmitting; and wherein the transmitter and the receiver switch roles causing a link reversal by changing voltages on the transmit signal lead and the complementary transmit signal lead of each, and by changing the impedance on the receive signal lead of each; whereby, a data signal applied to the transmit signal lead is wirelessly transmitted from the transmitter unit to the receiver unit and detected by the detection unit.

2. The capacitive communication system of claim 1, wherein the first and second conductive plates are approximately 1 inch in diameter.

3. The capacitive communication system of claim 1, wherein the adjustable capacitance semi-conductor device is a PIN diode.

4. The capacitive communication system of claim 1, wherein the detection unit is a microcontroller.

5. The capacitive communication system of claim 4, wherein the microcontroller measures the capacitance of the first conductive plate by measuring the decay time of a pulse applied to the transmit signal lead.

6. The capacitive communication system of claim 5, wherein the microcontroller establishes a capacitive baseline for the capacitance of the first conductive plate when there is a data low voltage on the transmit signal lead and the second conductive plate is in proximity to the first conductive plate.

7. The capacitive communication system of claim 1, wherein the transmitter is installed in a first toy, and the receiver is installed in a second toy.

8. The capacitive communication system of claim 1, wherein the transmitter comprises a series circuit including a first transistor, a first PIN diode, a second PIN diode and a second transistor, the first conductive plate electrically attached between the first and second PIN diodes.

9. The capacitive communication system of claim 8, wherein the first and second transistors are FET transistors, each having a gate, and wherein the transmit signal lead is electrically connected to the gate of the first transistor, and a complement transmit signal lead is electrically connected to the gate of the second transistor.

10. The capacitive communication system of claim 9, wherein, both the identical circuits have the receive signal lead electrically connected between the first PIN diode and the second PIN diode, the receive signal lead electrically connected to the detection unit.

11. The capacitive communication system of claim 10, wherein either of the identical circuits acts as a transmitter when the receive signal lead is placed in a high impedance state by the detector, and a complementary data signal is applied to the transmit signal lead and the complement transmit signal lead.

12. The capacitive communication system of claim 11, wherein either of the identical circuits acts as a receiver when the transmit signal lead and the complement transmit signal lead are held in a data low state, and the detector monitors the receive signal lead.

13. A capacitive communication system comprising: a transmitter having at least one PIN diode coupled to a first conductive plate, the first conductive plate having a capacitance; a receiver having a detector coupled to a second conductive plate; wherein, the system is constructed so that transmit data is applied to the at least one PIN diode to bias the PIN diode raising the capacitance of the first conductive plate, and to un-bias the at least one PIN diode lowering the capacitance of the first conductive plate; wherein, the detector is constructed to measure the capacitance of the first conductive plate when the second conductive plate is in proximity to the first conductive plate, and wherein, the capacitance of the first conductive plate is modulated either linearly or discretely to transmit information from the first conductive plate to the second conductive plate; and wherein the detector outputs said information by continuously measuring the capacitance of the first conductive plate; wherein the information is transmitted as m-ary amplitude shift keying (ASK) or by amplitude modulation or on-on-off keying (OOK); and, wherein the transmitter and the receiver switch roles causing a link reversal by changing voltages on the transmit signal lead and the complementary transmit signal lead of each, and by changing the impedance on the receive signal lead of each.

14. The capacitive communication system of claim 13, wherein the first and second conductive plates are approximately 1 inch in diameter.

15. The capacitive communication system of claim 13, wherein the detector is a microcontroller.

16. The capacitive communication system of claim 15, wherein the microcontroller baselines the capacitance of the first conductive plate when the capacitance of the first conductive plate is in a lowered state.

17. A method of near-field capacitive communication comprising: at a first location: lowering capacitance of a first conductive plate in a first data state; raising capacitance of the first conductive plate in a second data state; at a second location: detecting the capacitance of the first conductive plate with a second conductive plate in proximity to the first conductive plate; reporting a first data state or a second data state at the second conductive plate; switching roles of transmit and receive between the first and second locations by changing state of at least one signal line at both the first location and the second location.

18. The method of claim 17 further comprising baselining the capacitance of the first conductive plate in the first data state.

19. The method of claim 17 wherein the lowering or raising of the capacitance of the first conductive plate is controlled by at least one PIN diode.

* * * * *